United States Patent
Venkata

(10) Patent No.: US 9,239,652 B2
(45) Date of Patent: Jan. 19, 2016

(54) CURRENT CONVEYOR CIRCUIT

(75) Inventor: Harish Naga Venkata, Allen, TX (US)

(73) Assignee: NANYA TECHNOLOGY CORP., Gueishan Dist., Taoyuan (TW)

(*) Notice: Subject to any disclaimer, the term of this patent is extended or adjusted under 35 U.S.C. 154(b) by 869 days.

(21) Appl. No.: 13/540,636

(22) Filed: Jul. 3, 2012

(65) Prior Publication Data

US 2014/0009000 A1 Jan. 9, 2014

(51) Int. Cl.
*G06F 3/044* (2006.01)
*H03F 3/345* (2006.01)
*H03K 17/955* (2006.01)
*H02J 1/00* (2006.01)

(52) U.S. Cl.
CPC . *G06F 3/044* (2013.01); *H02J 1/00* (2013.01); *H03F 3/345* (2013.01); *H03K 17/955* (2013.01)

(58) Field of Classification Search
None
See application file for complete search history.

(56) References Cited

U.S. PATENT DOCUMENTS

| 6,344,769 | B1* | 2/2002 | Giuroiu | 327/538 |
| 6,351,155 | B1* | 2/2002 | Pogrebnoy | 327/51 |
| 6,784,725 | B1* | 8/2004 | Wadhwa et al. | 327/543 |
| 6,911,855 | B2* | 6/2005 | Yin et al. | 327/210 |
| 7,099,218 | B2* | 8/2006 | Wicht et al. | 365/207 |
| 2008/0239798 | A1 | 10/2008 | Sheu | |
| 2011/0026347 | A1 | 2/2011 | Fort | |

\* cited by examiner

*Primary Examiner* — Jared Fureman
*Assistant Examiner* — Joel Barnett
(74) *Attorney, Agent, or Firm* — Winston Hsu; Scott Margo

(57) ABSTRACT

A current conveyor circuit, which comprises: a first current transmitting route; a second current transmitting route, which has the same devices as the first current transmitting route; and at least one control circuit, to control the first current transmitting route and the second current transmitting route to enter a normal mode or a current splitting mode, wherein the first current transmitting route and the second current transmitting route are both enabled and can transmit current in the normal mode, where the first current transmitting route is enabled to transmit current but the second current transmitting route is disabled thus can not transmit current in the current splitting mode.

11 Claims, 5 Drawing Sheets

(a) Normal mode (b) Current splitting mode

US 9,239,652 B2

CURRENT CONVEYOR CIRCUIT

BACKGROUND OF THE INVENTION

1. Field of the Invention

The present invention relates to a current conveyor circuit, and particularly relates to a current conveyor circuit that can split current.

2. Description of the Prior Art

In a previous current conveyor circuit, currents flow in both a true route and a bar route. However, in such mechanism the two routes are not easily to match well thus may cause current difference between two routes. Accordingly, the current consumption is high, and current detection is not easily performed thereto.

SUMMARY OF THE INVENTION

Therefore, one objective of the present invention is to provide a current conveyor circuit that can split current.

One embodiment of the present invention provides a current conveyor circuit, which comprises: a first current transmitting route; a second current transmitting route, which has the same devices as the first current transmitting route; and at least one control circuit, to control the first current transmitting route and the second current transmitting route to enter a normal mode or a current splitting mode, wherein the first current transmitting route and the second current transmitting route are both enabled and can transmit current in the normal mode, where the first current transmitting route is enabled to transmit current but the second current transmitting route is disabled thus can not transmit current in the current splitting mode.

In view of above-mentioned embodiments, the current splitting can be easily performed via a simple circuit, thereby the current consumption can decrease since the current flows over only one route. By this way, the current is easily to be detected. Also, the circuit performance can be further improved via providing the isolating circuit or the biasing circuit to the routes.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
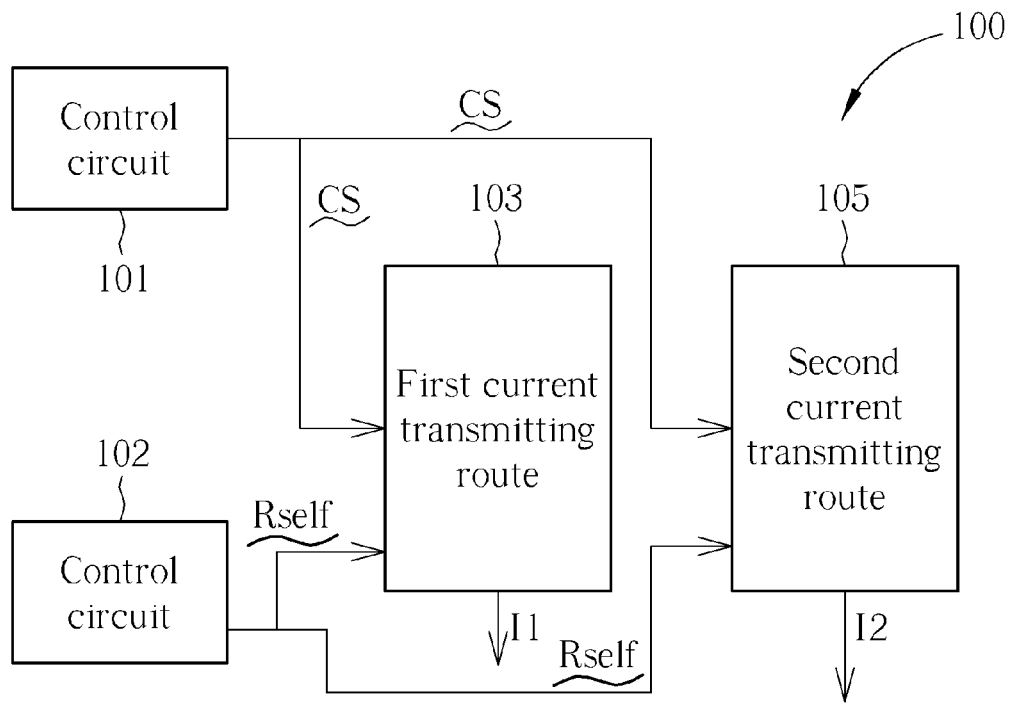
FIG. 1(*a*) and FIG. 1(*b*) are block diagrams illustrating operations of the current conveyor circuit according to the embodiment of the present application.
Figure 1:
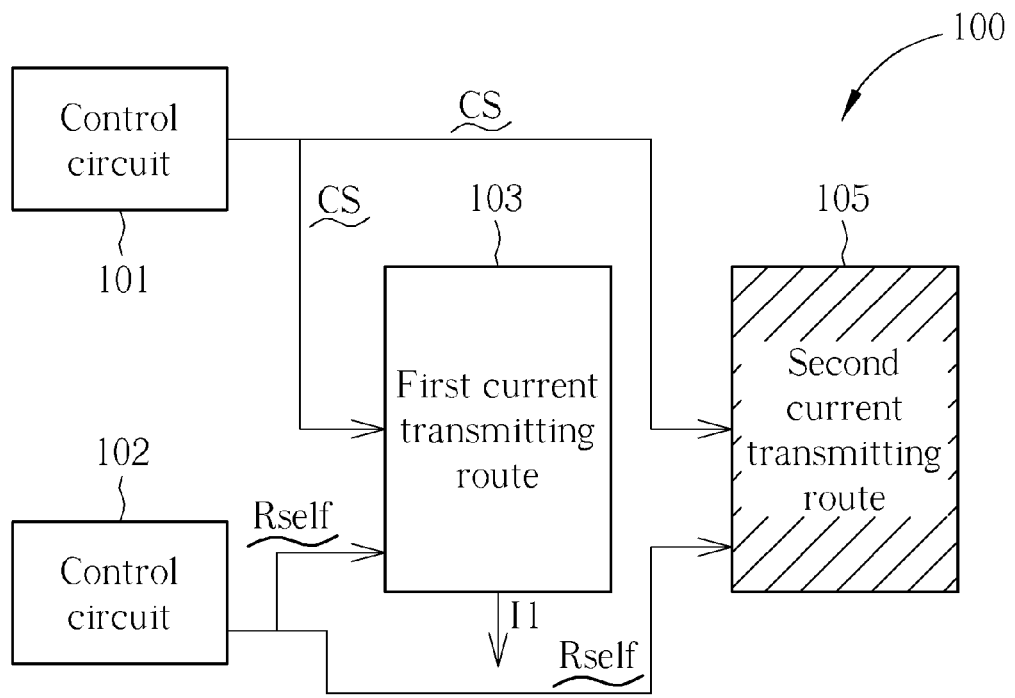

Block diagrams in FIG. 1(*a*) and FIG. 1(*b*) and circuit diagrams in FIGS. 2A, 2B, 3 and 4 are utilized to explain the concept of the present application. Please note the following description describe the situation when the embodiments are applied to a memory. However, please note each embodiment of the present invention can be applied to any other device. FIG. 1(*a*) and FIG. 1(*b*) are block diagrams illustrating operations of the current conveyor circuit 100 according to the embodiment of the present application. As shown in FIG. 1(*a*) and FIG. 1(*b*), the current conveyor circuit 100 comprises: control circuits 101, 102, a first current transmitting route 103, and a second current transmitting route 105. In one embodiment, the first current transmitting route 103 and the second current transmitting route 105 have the same devices. The current conveyor circuit 100 can operate in two modes: a normal mode as shown in FIG. 1 (*a*), and a current splitting mode as shown in FIG. 1(*b*). The control circuit 101, 102 respectively transmit a first control signal CS and a second control signal Rself to the first current transmitting route 103 or the second current transmitting route 105 to enter the normal mode or the current splitting mode. In the normal mode, both the first current transmitting route 103 and the second current transmitting route 105 are enabled and can respectively transmit currents I1, I2, as shown in FIG. 1(*a*). In the current splitting mode, the first current transmitting route 103 is enabled to transmit current I1 but the second current transmitting route 105 is disabled thus can not transmit current, as shown in FIG. 1(*b*). The control circuits 101, 102 can be independent circuits or be combined to be a single one circuitry. The control circuits 101, 102 can be implemented by hardware or software. For example, it can be a circuit independent from other circuits. Alternatively, control circuit 101 can be implemented by installing a program to a micro processor.

Figure 2A:
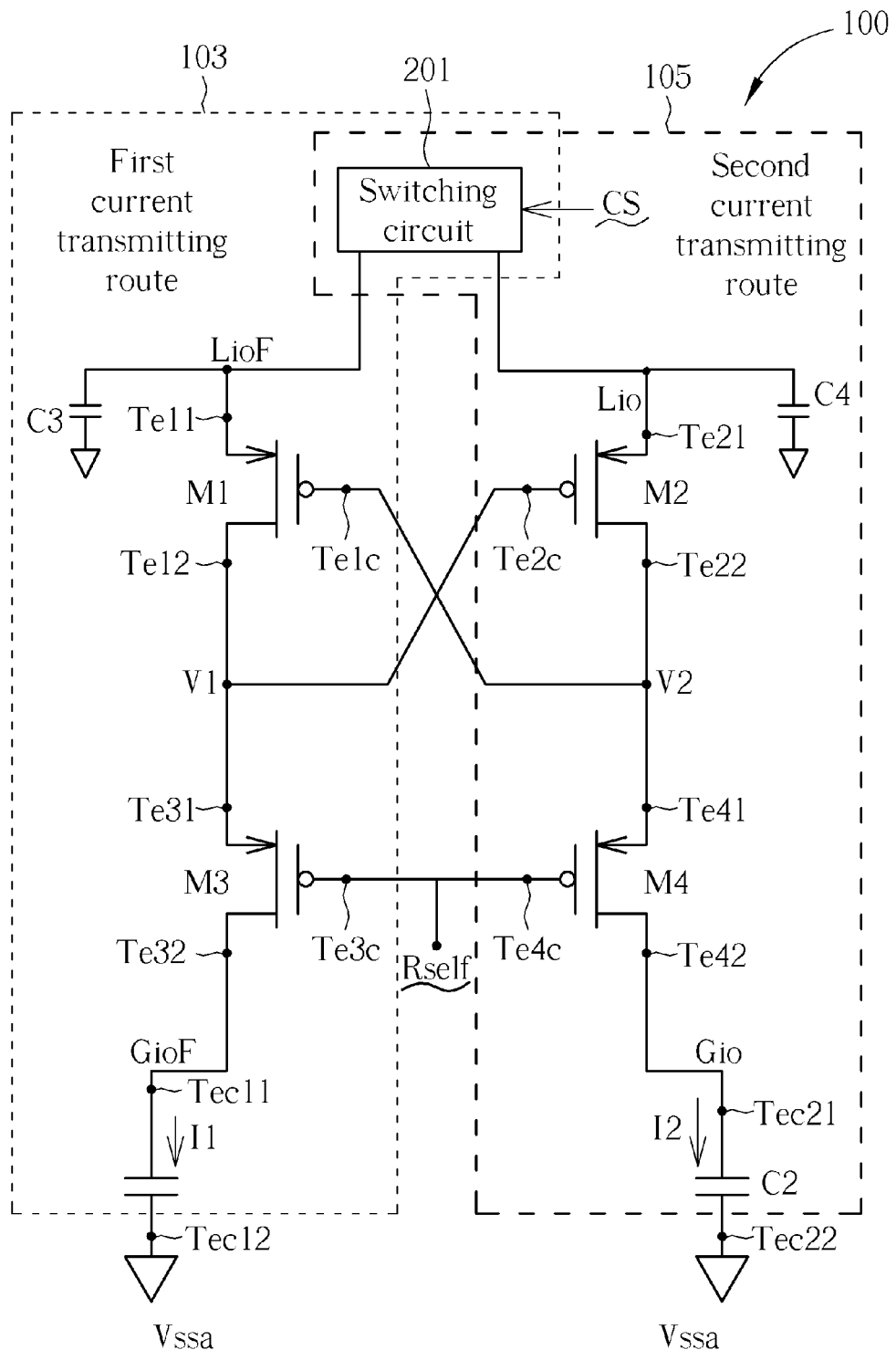
FIG. 2A is a circuit diagram illustrating detail circuit structures of the current conveyor circuit according to one embodiment of the present application.

FIG. 2A is a circuit diagram illustrating detail circuit structures of the current conveyor circuit 100 according to one embodiment of the present application. For brevity, the control circuit 101 in FIG. 1 is omitted in following embodiments. Please note the following circuit structures are only for example and do not mean to limit the scope of the present invention.

As shown in FIG. 2A, the first current transmitting route 103 and the second current transmitting route 105 are both coupled to a switching circuit 201 and share the switching circuit 202. However, the switch circuit 201 can be independent from the transmitting route 103 and the second current transmitting route 105. The first current transmitting route 103 includes a first switch device M1 and a third switch device M3. The first switch device M1 has a first terminal Te11 coupled to the switching circuit 201. The third switch device M3 has a first terminal Te31 coupled to a second terminal Te32 of the first switch device and has a second terminal Te32 coupled to a capacitor C1. The second current transmitting route 105 comprises a second switch device M2 and a fourth switch device M4. The second switch device M2 has a first terminal Te21 coupled to the switching circuit 201, has a control terminal Te2c coupled to the second terminal Te12 of the first switch device M1, and has a second terminal Te22 coupled to a control terminal Te1c of the first switch device M1. The fourth switch device M4 has a first terminal Te41 coupled to the second terminal Te22 of the second switch device M1, has a second terminal Te42 coupled to the capacitor C2, and has a control terminal Te4c coupled to a control terminal Te3c of the third switch device M3. The capacitor C1 has a first terminal Tec11 coupled to the second terminal Te32 of the third switch M3 and has a second terminal Tec12 coupled to the second predetermined voltage Vssa. The capacitor C2 has a first terminal Tec21 coupled to the second terminal Te42 of the fourth switch M4 and has a second terminal Tec22 coupled to the second predetermined voltage Vssa. Besides, the first current transmitting route 103 includes a capacitor C3 coupled to the first terminal Te11 of the switch device M1, and the second current transmitting route 105 includes a capacitor C4 coupled to the first terminal Te21 of the switch device M2.

In this embodiment, the control signal CS is transmitted to the switching circuit 201 thereby connects the second current transmitting route 105 to the first predetermined voltage Vcc in the normal mode and connects second current transmitting route 105 to the third predetermined voltage GND in the current splitting mode, depending on the first control signal CS. The first current transmitting route 103 includes two parts of lines: LioF line and GioF line, and the second current transmitting route 105 includes two parts of lines: Lio line and Gio line.

In one embodiment, the Gio line capacitance is higher than the Lio line capacitance, but not limited. If the current conveyor circuit 100 enters the current splitting mode, the switching circuit 201 connects the second current transmitting route 105 to GND such that LiOF still remains high but Lio is pulled down. After certain voltage split is achieved and the second control signal Rself goes low. Voltages at nodes V1 and V2 go up to Vtp (threshold voltage) of the third switch M3 and M4. AS soon as Lio goes below 2 Vtp, the second switch M2 is turned off and no current flows through Gio. Also as current flows through the first switch M1 and the third switch M3, the voltage at the node V1 rides up and cuts off the second switch M2 even before Lio reaches 2 Vtp. Since there is full Vcc voltage across LioF and GioF, current flows instantaneously from LioF to GioF. By this way, the second current transmitting route 105 stops transmitting the current I2.

Signals on the lines Lio/LioF are capacitive signals and Gio/GioF lines are also resistive and capacitive, since Lio/LioF lines hook to Gio/GioF lines. If the circuit shown in FIG. 2A is applied to a memory, the number of Lio/LioF lines depend on memory size, speed and architecture.

Figure 2B:
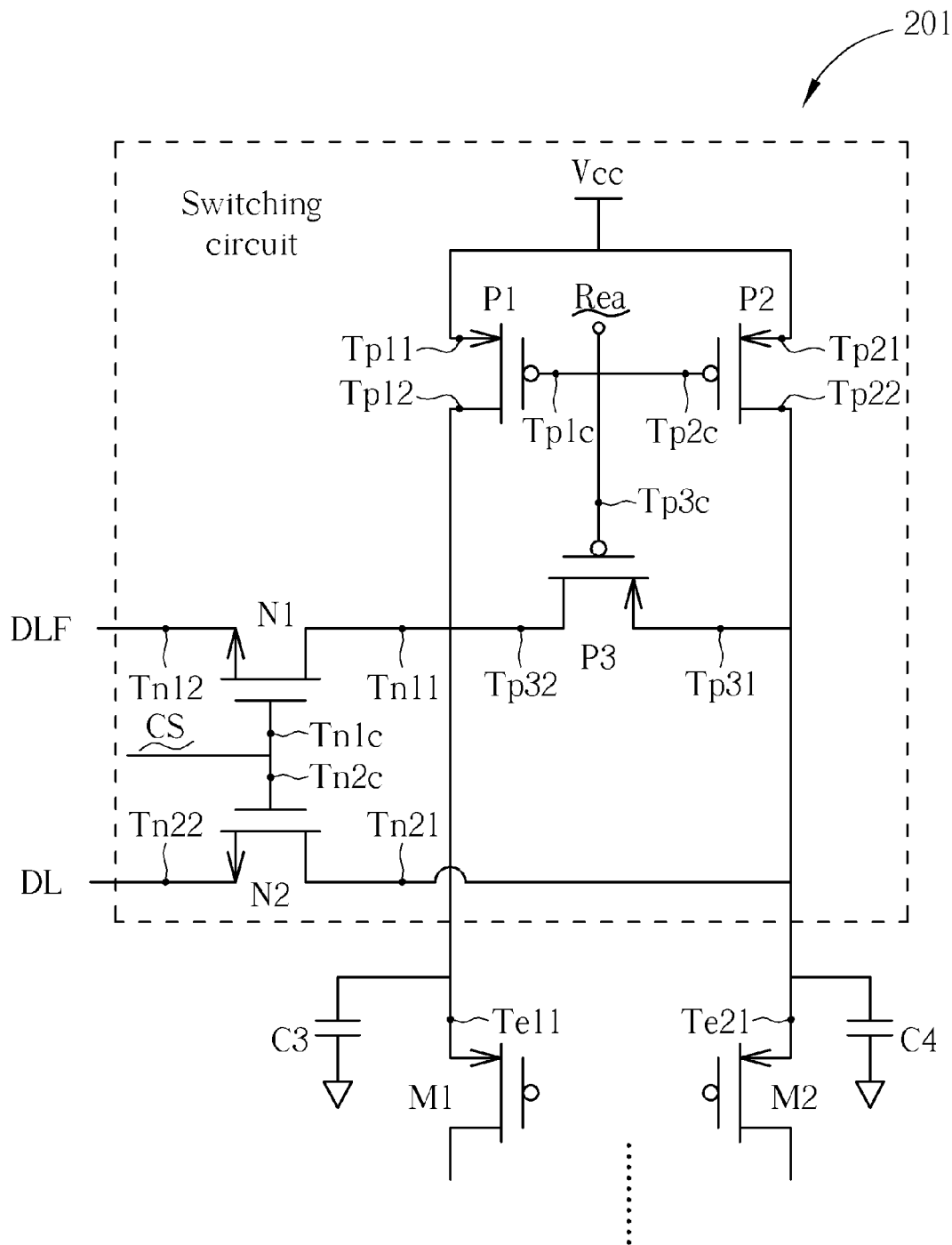
FIG. 2B is a circuit diagram illustrating an exemplary circuit structure for the switching circuit in FIG. 2A.

FIG. 2B is a circuit diagram illustrating an exemplary circuit structure for the switching circuit 201 in FIG. 2A. As shown in FIG. 2B, the switching circuit 201 includes transistors N1, N2, P1, P2, P3. The transistors N1, N2 are NMOSFETs in this embodiment and the transistors P1, P2, P3 are PMOSFETs in this embodiment. Control terminals Tp1c, Tp2c and Tp3c of the transistors P1, P2, P3 are coupled together to receive read enable signal Rea. First terminals Tp11 and Tp21 of the transistors P1, P2 are coupled to the first predetermined voltage Vcc. Second terminals Tp21 and Tp22 of the transistors P1, P2 are respectively coupled to the first terminal Tp31 and the second terminal Tp32 of the transistor P3. Additionally, the first terminal Tp31 and the second terminal Tp32 of the transistor P3 are respectively coupled to first terminals Te11 and Te21 of the switch devices M1, M2. The control terminals Tn1c, Tn2c of the transistors N1, N2 are coupled together to receive the first control signal CS. The first terminal Tn12 of the transistors N1 receives data DLF having a logic value 1 in this embodiment and the first terminal Tn22 of the transistors N2 receives data DL having a logic value 0 in this embodiment.

In one embodiment, the circuit depicted in FIG. 1, FIG. 2A and FIG. 2B are utilized in a memory, and the first control signal CS can be the signals utilized to select data location. Therefore the number for transistors receiving the first control signal CS can be any number depending on various kinds of parameters such as speed, leakage, architecture rather than a constant value 2 as shown in FIG. 2B. Before the read operation, Lio/LioF lines in FIG. 2A are pre-charged to Vcc through the transistors P1, P2, P3, and Gio/GioF lines are pre-charged to GND through NMOSFETs (not illustrated here) having similar structure of the transistors P1, P2, P3, but is not limited. Next, the read enable signal Rea turns off the transistors P1, P2, P3, thus Lio/LioF lines are floating pre-charged to Vcc. Similarly, Gio/GioF lines are floating pre-charged to GND. In this case, Lio/LioF lines correspond to each section of a memory and the memory in general have several sections.

Next, the first control signal CS goes high which pulls the Lio line towards to ground and holds the LioF line at Vcc, as above-mentioned description. While the Lio line is pulled towards ground after sufficient voltage split, which depends on Vt and Vt mismatch of transistors, is generated between lines Lio/LioF, the second control signal Rself goes low. After that, the current splitting operation as described above is performed. The amount of currents I1, I2 is a function of the capacitance on lines Lio/LioF lines, which is determined by transistors N1, N2 and wired capacitors such as the capacitors C3, C4.

Figure 3:
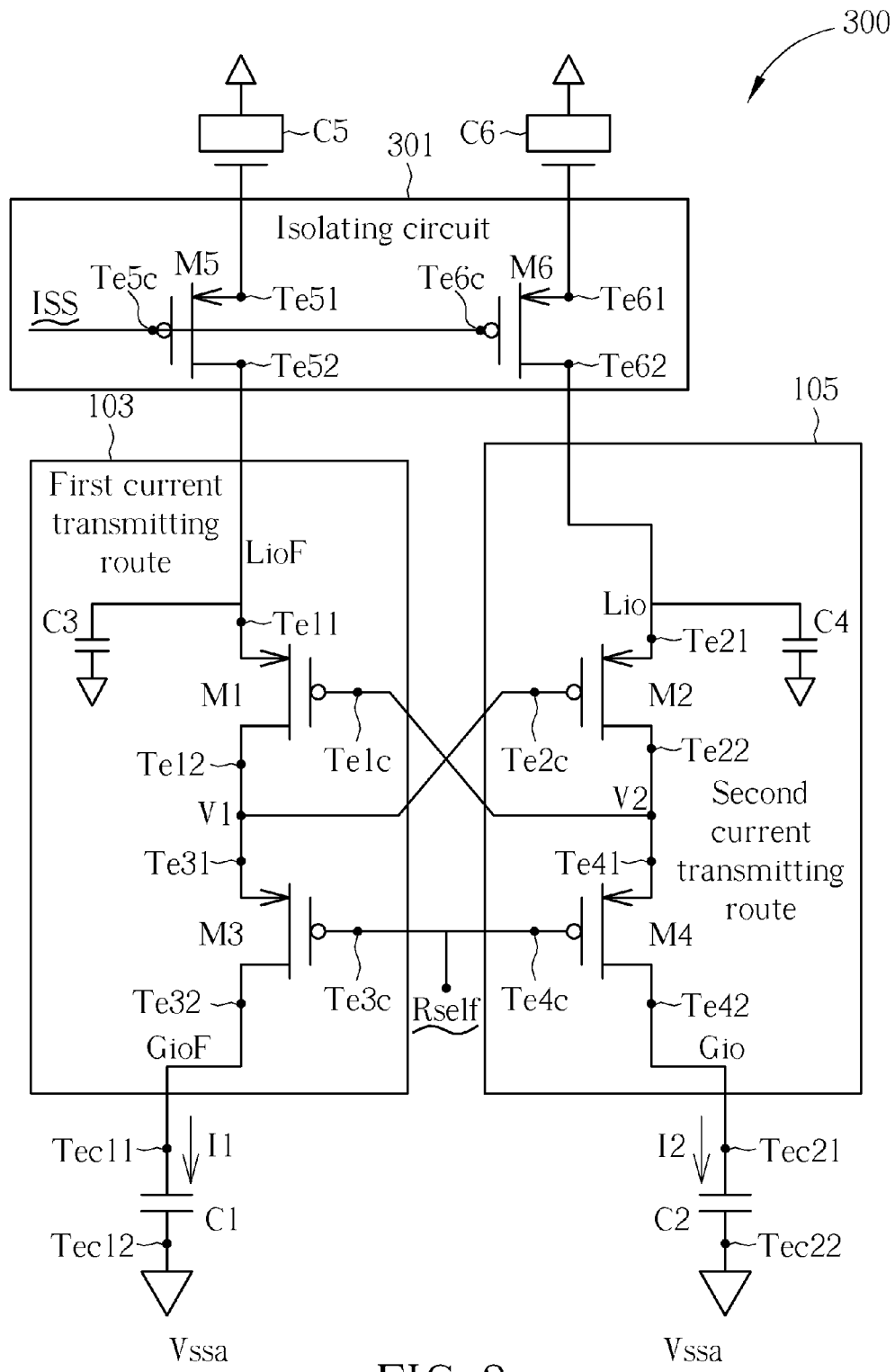
FIG. 3 is a circuit diagram illustrating detail circuit structures of the current conveyor circuit according to another embodiment of the present application.

FIG. 3 is a circuit diagram illustrating detail circuit structures of the current conveyor circuit 300 according to another embodiment of the present application. In this embodiment, the current conveyor circuit 300 also includes the first current transmitting circuit 103 and the second current transmitting circuit 105 and the switching circuit 201 (omitted in FIG. 3 for brevity), the same as the current conveyor circuit 100 shown in FIG. 2A. The current conveyor circuit 300 further includes a capacitor C5, a capacitor C6, and an isolating circuit 301. The capacitors C5 and C6 can be implemented by MOS transistors or metals. The isolating circuit 301 is for isolating the first current transmitting route 103 from the capacitor C6, and for isolating the second current transmitting route 105 from the capacitor C7 according to an isolating signal ISS. In one embodiment, the isolating circuit 301 is enabled only during a writing operation of a memory. That is, the first current transmitting circuit 103 and the second current transmitting circuit 105 are coupled to the capacitors C5, C6 during the reading operation for a memory but are isolated from the capacitors C5, C6 during the writing operation for a memory. By this way, the current flowing the Lio/LioF lines can be enhanced via adding extra capacitance, and the writing operation suffers no harm. Additionally, the isolating signal ISS equals to the signal Rself in one embodiment.

In this embodiment, the isolating circuit 301 includes a fifth switch device M5 and a sixth switch device M6. The fifth switch device M5 is for isolating the capacitor C5 and the first switch device M1 according to the isolating signal ISS, has a first terminal Te51 coupled to the capacitor C5, has a second terminal Te52 coupled to the first terminal Te11 of the first switch device M1, and has a control terminal Te5c receiving the isolating signal ISS. The sixth switch device M6 is for isolating the capacitor C6 and the second switch device M2 according to the isolating signal ISS, has a first terminal Te61 coupled to the capacitor C6, has a second terminal Te62 coupled to the first terminal Te21 of the second switch device M2, and has a control terminal Tec6 receiving the isolating signal ISS.

Figure 4:
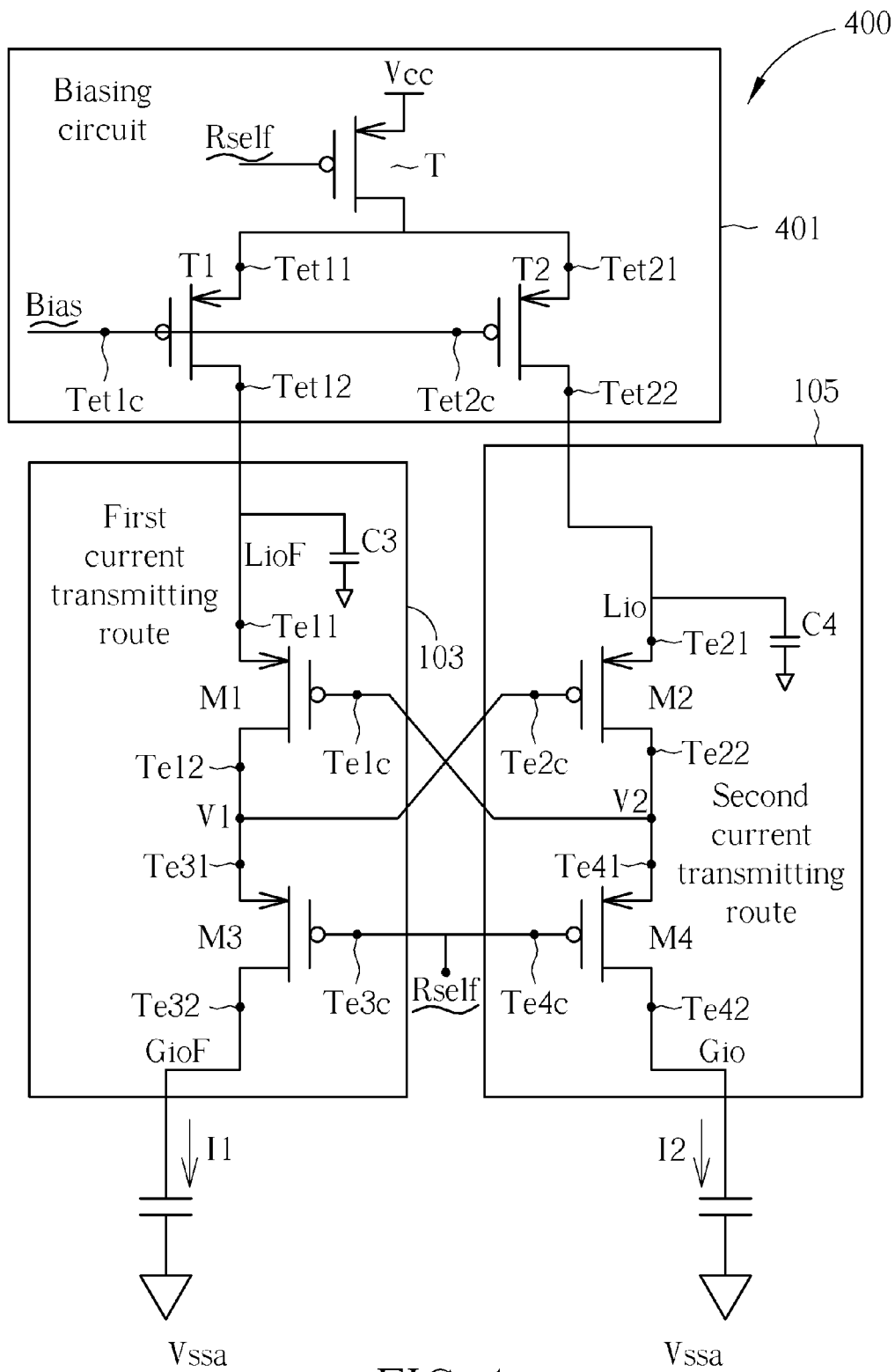
FIG. 4 is a circuit diagram illustrating detail circuit structures of the current conveyor circuit according to still another embodiment of the present application.

FIG. 4 is a circuit diagram illustrating detail circuit structures of the current conveyor circuit 400 according to still another embodiment of the present application. In this embodiment, the current conveyor circuit 400 further comprises a biasing circuit 401 for biasing the first current transmitting route 103 and the second current transmitting route 105. The biasing circuit 401 can include a current source implemented by a transistor T coupled to a voltage Vcc, a first transistor T1 and a second transistor T2, which are implemented by P type MOSFETs, but not limited. The transistor T is utilized to turn on or to turn off the biasing circuit 401. The first transistor T1 is for providing a first biasing voltage to the first switch device M1, has a first terminal Tet11 coupled to the current source to receive part of constant current, and has a second terminal Tet12 coupled to the first terminal Te1 of the first switch device M1. The second transistor T2, is for providing a second biasing voltage to the second switch device M2, for receiving part of constant current, has a first terminal Tet21 coupled to the current source to receive part of constant current, and has a second terminal Tet22 coupled to the first terminal Te21 of the second switch device M2. The control terminals of the first transistor T1 and the second transistor T2 both receive the biasing signal Bias controlling the operations thereof. In this embodiment, the first transistor T1 and the second transistor T2 operate in a saturation region. In one embodiment, the biasing circuit 401 is enabled only in the reading operation for memory, therefore the transistor T can receive the second control signal Rself to control the operation thereof.

In view of above-mentioned embodiments, the current splitting can be easily performed via a simple circuit, thereby the current consumption can decrease since the current flows over only one route. By this way, the current is easily to be detected. Also, the circuit performance can be further improved via providing the isolating circuit or the biasing circuit to the routes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current conveyor circuit, comprising:
a switching circuit;
a first current transmitting route;
a second current transmitting route, having the same devices as the first current transmitting route; and
at least one control circuit, comprising a first control circuit and a second control circuit, to control the first current transmitting route and the second current transmitting route to enter a normal mode or a current splitting mode, wherein the first current transmitting route and the second current transmitting route are both enabled and can transmit current in the normal mode, where the first current transmitting route is enabled to transmit current but the second current transmitting route is disabled thus cannot transmit current in the current splitting mode;
wherein the first current transmitting route comprises:
a first switch device, having a first terminal coupled to the switching circuit; a third switch device, having a first terminal coupled to a second terminal of the first switch device, and having a second terminal;
a first capacitor, having a first terminal coupled to the second terminal of the third switch device, and having a second terminal coupled to a second predetermined voltage level;
a third capacitor, coupled to the first terminal of the first switch device;
wherein the second current transmitting route comprises:
a second switch device, having a first terminal coupled to the switching circuit, having a control terminal coupled to the second terminal of the first switch device, and having a second terminal coupled to a control terminal of the first switch device;
a fourth switch device, having a first terminal coupled to the second terminal of the second switch device, having a second terminal coupled to the second predetermined voltage level, and having a control terminal coupled to a control terminal of the third switch device;
a second capacitor, having a first terminal coupled to the second terminal of the fourth switch device, and having a second terminal coupled to the second predetermined voltage level; and
a fourth capacitor, coupled to the first terminal of the second switch device;
wherein the switch circuit receives a first control signal from the first control circuit to connect the second current transmitting route to a first predetermined voltage in the normal mode and connects the second current transmitting route to a third predetermined voltage in the current splitting mode;
where the third switch device and the fourth switch device receive a second control signal from the second control circuit to turn on after the second current transmitting route is connected to the third predetermined voltage,
wherein the switching circuit includes:
a first type one transistor, having a first terminal coupled to the first predetermined voltage;
a second type one transistor, having a first terminal coupled to the first predetermined voltage;
a third type one transistor, having a first terminal coupled to a second terminal of the second type one transistor, having a third terminal coupled to a second terminal of the first type one transistor, and having a control terminal coupled to control terminals of the second type one transistor and the third type one transistor;
a first type two transistor, having a first terminal coupled to the second terminal of the third type one transistor, and having a control terminal receiving the first control signal; and
a second type two transistor, having a first terminal coupled to the first terminal of the third type one transistor, and having a control terminal receiving the first control signal.

2. The current conveyor circuit of claim 1, applied to a memory, wherein the first control signal is a signal to select data location for the memory.

3. The current conveyor circuit of claim 1, further comprising:
a fifth capacitor, coupled to the first current transmitting route;
a sixth capacitor, coupled to the second current transmitting route; and
a isolating circuit, for isolating the first current transmitting route from the fifth capacitor, and for isolating the second current transmitting route from the sixth capacitor according to an isolating signal.

4. The current conveyor circuit of claim 3, wherein the isolating signal has the same phase as which of the second control signal.

5. The current conveyor circuit of claim 3, wherein the isolating circuit comprises:
- a fifth switch device, having a first terminal coupled to the fifth capacitor, having a second terminal coupled to the first current transmitting route, and having a control terminal receiving the isolating signal; and
- a sixth switch device, having a first terminal coupled to the sixth capacitor, having a second terminal coupled to the second current transmitting route, and having a control terminal receiving the isolating signal.

6. The current conveyor circuit of claim 5, applied to a memory, wherein the fifth switch device and the sixth switch device only turn on only during a reading operation of the memory.

7. The current conveyor circuit of claim 1, further comprising a biasing circuit for biasing the first current transmitting route and the second current transmitting route.

8. The current conveyor circuit of claim 7, wherein the biasing circuit comprising:
- a current source, for providing a constant current;
- a first transistor, for receiving part of constant current, the having a first terminal coupled to the current source, and having a second terminal coupled to the first current transmitting route; and
- a second transistor, for receiving part of constant current, having a first terminal coupled to the current source, and having a second terminal coupled to the second current transmitting route.

9. The current conveyor circuit of claim 8, wherein the first transistor and the second transistor are P type MOSFETs and operate in a saturation region.

10. The current conveyor circuit of claim 8, wherein the current source receives the second control signal to control the operation thereof.

11. The current conveyor circuit of claim 8, applied to a memory, wherein the current source only operates during a reading operation for the memory.

* * * * *